United States Patent [19]

Palara

[11] Patent Number: 5,008,771
[45] Date of Patent: Apr. 16, 1991

[54] DIAGNOSTIC CIRCUIT FOR UNITS PROVIDING CURRENT CONTROL AND PROTECTION AGAINST EXCESSIVE HEAT DISSIPATION FOR SEMICONDUCTOR POWER DEVICES

[75] Inventor: Sergio Palara, Acicastello, Italy

[73] Assignee: SGS-Thomson Microelectronics s.r.l., Agrate Brianza, Italy

[21] Appl. No.: 446,857

[22] Filed: Dec. 6, 1989

[30] Foreign Application Priority Data

Dec. 13, 1988 [IT] Italy .................... 22924 A/88

[51] Int. Cl.$^5$ ........................... H02N 3/087
[52] U.S. Cl. ..................... 361/103; 261/98; 261/101; 307/310
[58] Field of Search ............ 361/87, 93, 98, 101, 361/103; 223/907; 307/210

[56] References Cited

U.S. PATENT DOCUMENTS 4,698,655 10/1987 Schultz .................... 361/103 X
4,703,390 10/1987 Fay et al. .................. 361/98 X Primary Examiner—Derek S. Jennings
Attorney, Agent, or Firm—Sixbey, Friedman, Leedom & Ferguson

[57] ABSTRACT

The diagnostic circuit comprises a comparator having a first input connected to the power device and a second input connected to a reference voltage generator. A signal generator is connected to the output of comparator so as to generate a diagnostic signal when comparator detects a current in the power device which is higher than a preset value corresponding to said reference voltage. A thermal protection unit sensitive to the temperature of the power device acts on the reference voltage generator so as to reduce the value of said reference voltage in response to an increase in the temperature beyond a preset limit.

11 Claims, 2 Drawing Sheets

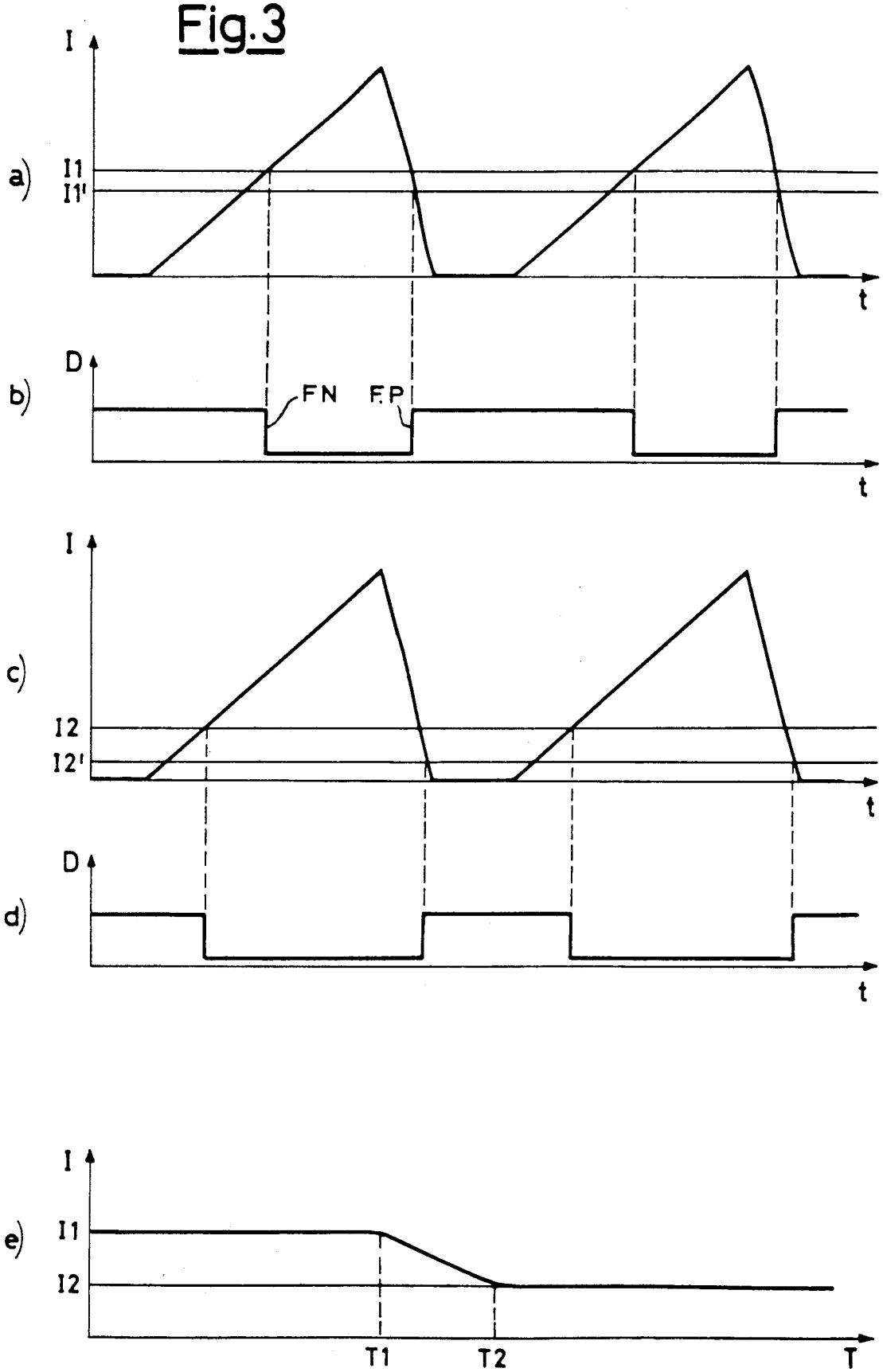

DIAGNOSTIC CIRCUIT FOR UNITS PROVIDING CURRENT CONTROL AND PROTECTION AGAINST EXCESSIVE HEAT DISSIPATION FOR SEMICONDUCTOR POWER DEVICES

DESCRIPTION

The present invention relates to a diagnostic circuit for units providing current control and protection against excessive heat dissipation for semiconductor power devices.

Many applications are known wherein a semiconductor power device for supplying a load, say for the electronic ignition of a motor vehicle or for driving an electric motor, must be equipped with a control unit capable of inducing the periodic quenching of the power device in relation to the current passing through it.

More accurately, in the case of a power device used for supplying an electric coil for electronic ignition, the control unit must be capable of reading the value of the current supplied to the load and of inducing the rapid quenching of the power device when the current detected is greater than a present value. There is then created across the coil an overvoltage which by means of a secondary winding triggers the ignition spark.

The control units currently used for such a purpose comprise a diagnostic circuit which reads the current supplied to the load and generates a diagnostic signal when the detected current is greater than a present value, a microprocessor with a delay device which receives said diagnostic signal and converts it into a quenching signal with a preset time delay and a drive circuit controlled by the microprocessor to induce the quenching of the power device.

In the case of a power device used for driving an electric motor, the control unit on the other hand has the task of determining the alternation of firings and quenchings (that is, the duty cycle) of the power device and with it the speed of the driven motor.

To this purpose the control unit still comprises a diagnostic circuit which, in relation to the comparison between the current supplied to the load and a preset value, acts in a suitable manner on a control circuit of the duty cycle of the signal applied to the power device.

It is important that the power devices thus used be equipped with a protection against excessive heat dissipation, which could induce a dangerous increase in the power device's junction temperature beyond a safety limit.

There are not currently known any semiconductor power devices, wherein a single diagnostic circuit is capable of absolving both functions of current reading and heat protection.

In particular there are not known any diagnostic circuits for control units of semiconductor power devices, which combine the two above functions within a single integrated circuit.

The primary object of the present invention is thus to accomplish a diagnostic circuit for control units of semiconductor power devices, which combine the twin function of current reading and heat protection.

A further object of the present invention is that of accomplishing a diagnostic circuit of the above type, which can be integrated into a single monolithic structure.

In view of these objects there is accomplished according to the invention a diagnostic circuit characterized in that it comprises a comparator having a first input connected to the power device so as to be supplied with a voltage proportional to the current passing through the device itself and a second input connected to a reference voltage generator, a signal generator connected to the output of said comparator so as to generate a diagnostic signal whenever the output of the comparator indicates the growth of said voltage proportional to the current beyond said reference voltage, and means sensitive to the temperature of the power device which act on said reference voltage generator so as to reduce said reference voltage in response to an increase in temperature beyond a preset limit.

Put into other words, the reference voltage generator sets the trigger threshold of the diagnostic circuit and such trigger threshold is automatically reduced whenever excessive heat dissipation raises the power device's junction temperature beyond a preset limit.

This means that, in the case of a power device used for electronic ignition, the device's quenching instant is advanced so as to occur for a smaller current with consequent reduction of the power dissipated within the device and thus of the junction temperature of same. In the case of a power device used for driving an electric motor, the same effect is, on the other hand, obtained by reducing the duty cycle of the signal applied to the device itself.

Preferably, the entire circuit unit formed by the power device and by the diagnostic circuit is integrated in a monolithic structure, so as to make it easier to read the current.

Again preferably, the reduction of the reference voltage as temperature increases is made to occur with continuity, so that the trigger threshold of the diagnostic circuit also varies with continuity and with it the power dissipated by the device.

Lastly the comparator is of the hysteresis type, that is it commutates its output on the state which determines the delivery of the diagnostic signal for a value of current which is higher than that which determines the inverse commutation. This eliminates unwanted instabilities.

These and other characteristics of the present invention, together with the advantages obtained, will be evident from the following detailed description of some embodiments of the present invention illustrated, as a non-limiting example, in the enclosed drawings, wherein:

FIG. 3 shows a series of diagrams representative of the manner of operation of the diagnostic circuit of FIG. 2;

Figure 1:
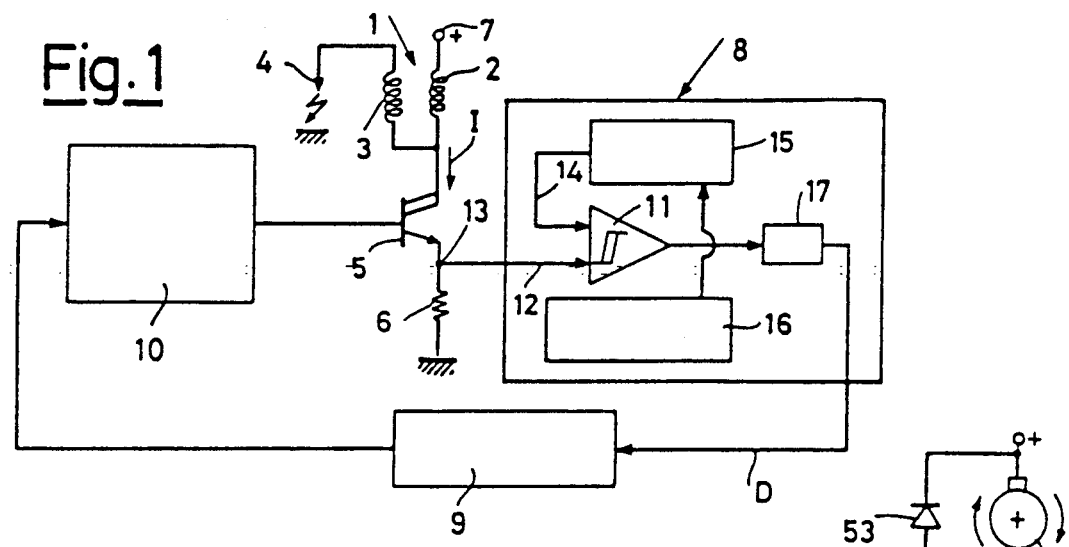
FIG. 1 shows a block diagram of semiconductor power device for electronic ignition, including a diagnostic circuit according to the present invention.

In FIG. 1 there is schematically illustrated an electronic ignition circuit for a motor vehicle, which comprises an electric coil 1 having a primary winding 2 and a second winding 3, the latter being used to induce a spark between an electrode 4 and ground. The primary winding 2 is connected in series to a semiconductor power device 5 (represented by way of an example as a Darlington circuit, but clearly it could be of any known type) and a resistance 6 between a positive power supply terminal 7 and ground.

There is associated with the power device 5 a control unit constituted essentially by a diagnostic circuit 8, by a microprocessor 9 with an incorporated delay device and by a drive circuit 10.

The diagnostic circuit 8 comprises a hysteresis comparator 11, which has a first input 12 connected to an circuit branch point 13 intermediate between the emitter of the power device 5 and the resistance 6 and a second input 14 connected to a reference voltage generator 15. A thermal protection unit 16, sensitive to the temperature of power device 5, acts on generator 15 so as to reduce the reference voltage applied across the second input of comparator 11 should the temperature rise due to excessive heat dissipation. A signal generator 17 is connected to the output of comparator 11 so as to generate a diagnostic signal D whenever the current I passing through the power device 5, and thus the primary winding 2 of coil 1, rises to generate across resistance 6 a proportional voltage, applied across the first input of comparator 11, which is greater than the reference voltage applied across the second input of the same comparator.

In this way microprocessor 9 is put into the position of controlling, with a suitable delay, the drive circuit 10 to induce the rapid quenching of power device 5. At this point across the primary of coil 1 there is a strong overvoltage which, transferred onto the secondary 3, induces the ignition spark to jump.

In case of excessive heat dissipation and consequent rise in the junction temperature of power device 5, the thermal control unit 16, as already said, reduces the reference voltage of comparator 11, thus lowering the trigger threshold of the same comparator and thus advancing the quenching of power device 5 to a lower current value.

Preferably, the diagnostic circuit 8 is constructed together with power device 5 and resistance 6 in a single integrated circuit structure, so as to make it easier to take the temperature.

Figure 2:
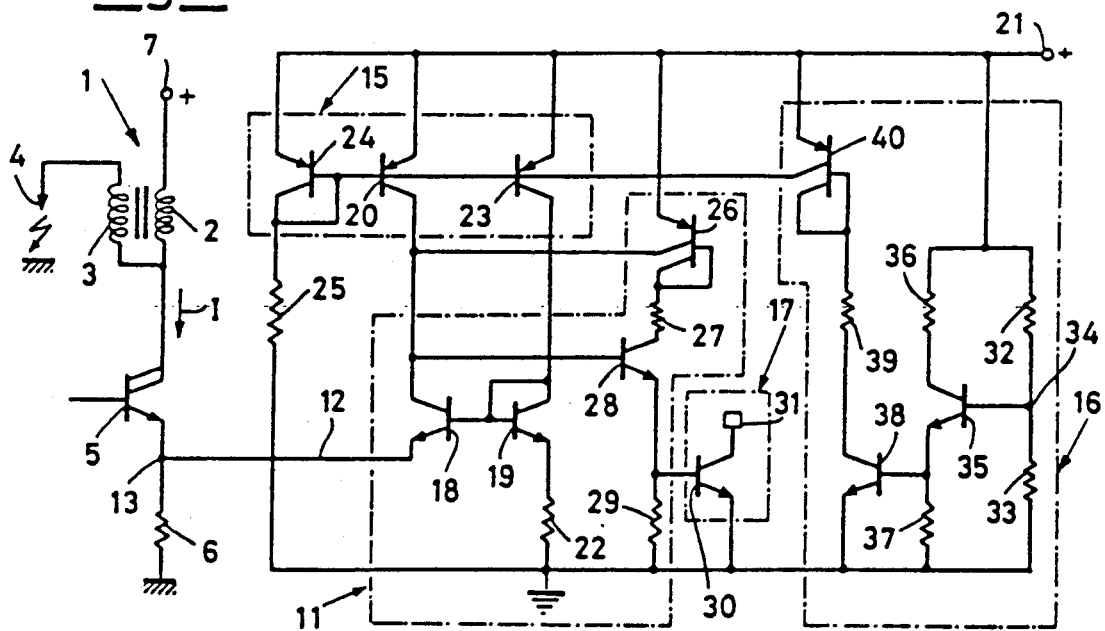
FIG. 2 shows a circuit diagram of an example of an embodiment of the above diagnostic circuit, suitable for implementation in an integrated form.

An example in this sense is shown in detail in FIG. 2, wherein comparator 11 is seen to comprise a differential stage constituted by two NPN transistors 18 and 19 whose bases are connected together. Transistor 18 has the emitter connected to circuit branch point 13, so as to constitute a first input 12 of comparator 11, and the collector connected to a the collector of a PNP transistor 20, whose emitter is connected to a positive terminal 21. In turn transistor 19 has its emitter connected to ground through a resistance 22 and the collector connected directly to the base of the same transistor and also connected to the collector of a PNP transistor 23, whose emitter is connected to positive terminal 21. The bases of transistors 20 and 23 are connected together and to the base of a PNP transistor 24, whose emitter is connected to positive terminal 21 and whose collector is connected directly to the base of the same transistor and also connected to ground through a resistance 25. Transistors 20, 23 and 24 together with resistances 22 and 25, constitute the reference voltage generator 15.

Comparator 11 also comprises a twin-collector PNP transistor 26, whose emitter is connected to the positive terminal 21, a first collector connected to the collector of transistor 20 and a second collector connected directly to the base of the same transistor and also connected through a resistance 27 to the collector of an NPN transistor 28, whose base is connected to the collector of transistor 18 and whose emitter is connected to ground through a resistance 29.

The diagnostic signal generator 17 is constituted in the example of FIG. 2 by an NPN transistor 30 having an open collector, having precisely the emitter connected to ground, the base connected to the emitter of transistor 28 and the collector connected through a terminal 31 to the input of microprocessor 9.

The thermal protection unit 16 comprises lastly a voltage divider formed by two resistances 32 and 33 connected in series between the positive terminal 21 and ground. An intermediate branch point 34 between the above resistances is connected to the base of an NPN transistor 35, whose collector is connected to the positive terminal 21 through a resistance 36 and whose emitter is connected to ground through a resistance 37. The emitter of transistor 37 is also connected directly to the base of an NPN transistor 38, whose emitter is connected to ground and whose collector is connected through a resistance 39 to the base of a PNP transistor 40, whose emitter is connected to the positive terminal 21, a first collector is connected to the common base of transistors 20, 23 and 24 and a second collector is connected directly to the base of the same transistor 40.

During operation, the two transistors 18 and 19 of the differential stage of comparator 11 are supplied at the collector from transistors 20 and 23, which conduct a constant current thanks to their current mirror connection with transistor 24, through which there flows a constant current depending on the value of resistance 25.

When power device 5 is quenched, no current passes through resistance 6, so that the emitter of transistor 18 is grounded, while that of transistor 19, which is diode-connected, is at a voltage equal to the voltage drop across resistance 22. Supposing that the emitter areas of transistors 18 and 19 are equal (as is the actual case), the conduction of transistor 18 is consequently much greater than that of transistor 19, so that transistor 18 is in saturation and keeps interdicted transistor 27, and thus transistor 30 of the diagnostic signal generator 17.

When power device 5 is caused to be in conduction, the current I passing through it rises according to a linear ramp as shown in graph (a) of FIG. 3. With it there grows the voltage across resistance 6 and thus that of emitter of transistor 18. The differential stage constituted by transistors 18 and 19 reaches its balance when the two transistors have the same emitter voltage; this occurs for a preset value of current I1 which depends on the reference voltage established across resistance 22.

When current I is larger than I1 (FIG. 3a), the differential stage 18, 19 is unbalanced and transistor 18 interdicts itself. Thus transistor 27 is activated, going to saturation and activating transistor 30, whose collector delivers to microprocessor 9 the diagnostic signal D, constituted by a voltage which at that instant has a negative front (FIG. 3b).

With a preset time delay, microprocessor 9 then commands through a drive circuit 10 the quenching of power device 5 with the effect explained above of inducing an overvoltage across coil 1 and inducing the spark to jump between electrode 4 and ground.

Comparator 11 returns to its original state, with consequent positive front FP of diagnostic signal D (FIG.

3b), when current I, due to the quenching of power device 5, returns below the value I1.

So as to avoid unwanted instabilities, it is appropriate that comparator 11 have a hysteresis ranging from the value of the current (I1) which induces it to commutate to the state corresponding to the generation of the diagnostic signal D and the (lower) one which commutates it to the opposite direction.

Hysteresis is conferred to comparator 11 by transistor 26, which is accomplished with two thirds of the collector being diode-connected to the base and one third of the collector connected to the collector of transistor 18. This means that, once transistor 26 has been taken to conduction by the interdiction of transistor 18, the latter's new condition occurs with a collector current equal to the sum of the currents delivered by transistors 20 and 26 and thus for a lower emitter voltage of transistor 18, that is for a current I1' which is less than I1. This is highlighted in graphs (a) and (b) of FIG. 3.

It may occur that an excessive heat dissipation during the power device's conduction cycles determines an unwanted increase in the junction temperature of the device itself, and, in a way, of the temperature of the chip which contains the power device 5, the resistance 6 and the diagnostic circuit 8.

It is know from prior art that, when a given voltage is fixed on the base of transistor 35, transistor 38 will fire when the temperature reaches a certain preset value, say T1=150° C. At this temperature transistor 38 induces conduction of transistor 40, which is accomplished with two thirds of the collector connected to its own base and one third connected to the common base of transistors 20, 23, 24. Part of the current passing through transistor 38 is consequently made to flow through resistance 25 with the result of reducing the currents of transistors 20 and 23 and therefore of transistors 18 and 19. The voltage across the emitter of transistor 19 is thus reduced, and with it the emitter voltage of transistor 18 is also reduced, that is the current on resistance 6, which determines the commutation of comparator 11 and the delivery of diagnostic signal D. As a consequence, the diagnostic signal is advanced and with it the quenching of the power device. This is well highlighted in graphs (c) and (d) of FIG. 3, wherein it is seen that the comparator's hysteresis is also modified, since the difference between the two commutation limits is increased.

The fall in the threshold current occurs in a linear manner in relation to the temperature until it reaches a minimum value I2 at a temperature T2, say equal to 170° C. The variation of the threshold current in relation to temperature is illustrated in graph (e) of FIG. 3.

Figure 4:
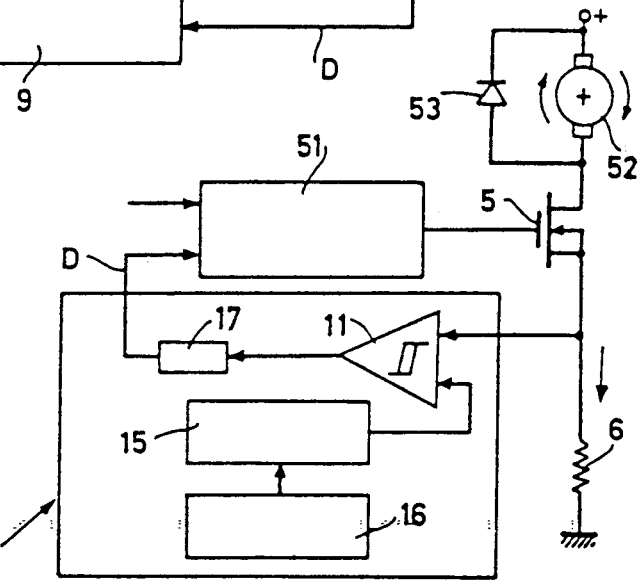
FIG. 4 shows a block diagram of a control unit of a semiconductor power device for driving motors, including a diagnostic circuit of the type illustrated in FIGS. 1 and 2.

In FIG. 4 the same diagnostic circuit is shown used in the application of a diagnostic signal to one of the two inputs (the other being supplied with a usual constant value input signal) of a control circuit 51 of the duty cycle of a semiconductor power device 5 (this time represented as an MOS transistor) used for driving an electric motor 52 with a diode 53 connected in parallel.

In this case the diagnostic circuit operates so as to reduce the power device's duty cycle as the temperature of the device itself increases. The behaviour of the diagnostic circuit is that described with reference to FIGS. 1, 2 and 3.

What is claimed is:

1. A diagnostic and control circuit for operating a semiconductor power device through periodic firing and quenching states comprising a comparator having a first input connected to the power device so as to be supplied with a voltage proportional to a current passing through the power device and a second input connected to a reference voltage generator, a signal generator connected to an output of said comparator so as to generate a diagnostic signal whenever the comparator output indicates the periodic growth of said proportional voltage beyond a reference voltage generated by said reference voltage generator, and means sensitive to the temperature of the power device which act on said reference voltage generator so as to reduce said reference voltage in response to a temperature increase beyond a preset limit.

2. Diagnostic circuit according to claim 1, characterized in that said voltage proportional to the current is taken across a resistance connected in series with the power device.

3. Diagnostic circuit according to claim 2, characterized in that said comparator, said reference voltage generator, said signal generator, said means sensistive to temperature, said power device and said resistance are included in a single integrated circuit.

4. Diagnostic circuit according to claim 1, characterized in that said comparator is of the hysteresis type.

5. Diagnostic circuit according to claim 1, characterized in that said means sensitive to temperature act on said reference voltage generator so as to reduce said reference voltage in a continuous manner within a preset range of temperatures.

6. Diagnostic circuit according to claim 1, characterized in that said comparator comprises a differential stage formed by two transistors having a common base supplied with a constant current through a current mirror circuit, one of said transistors being polarized through a resistance connected in series to said power device and the other of said transistors being polarized through a further resistance defining said reference voltage.

7. Diagnostic circuit according to claim 6, characterized in that said comparator also comprises circuit means which, in response to the commutation of said differential stage to the state corresponding to the rise of said voltage proportional to the current beyond said reference voltage, determine the rise in the supply current of said transistor of the differential stage, so that the inverse commutation of said comparator occurs at a voltage which is lower than the above proportional voltage.

8. Diagnostic circuit according to claim 6, characterized in that said means sensitive to temperature comprise a voltage divider used for the polarization of a transistor used to commutate to conduction when the temperature goes beyond a preset limit defined by said voltage divider, said transistor acting on said mirror current circuit so as to reduce said constant current supplying the transistors of the differential stage of comparator and thus vary said reference voltage.

9. Diagnostic circuit according to claim 6, characterized in that said diagnostic signal generator is constituted by an open-collector transistor.

10. A diagnostic circuit for units providing current control and protection against excessive heat dissipation for semiconductor power devices, comprising a comparator having a first input connected to the power device so as to be supplied with a voltage proportional to a current passing through the device and a second input connected to a reference voltage generator, a signal generator connected to the output of said comparator so as to generate a diagnostic signal whenever the output from the comparator indicates a growth of said voltage proportional to the current beyond a reference voltage generated by said reference voltage generator, and means sensitive to the temperature of the power device which act on said reference voltage generator so as to reduce said reference voltage in response to an increase in temperature beyond a preset limit, wherein said comparator includes a differential stage formed by two transistors having a common base supplied with a constant current through a current mirror circuit, one of said transistors being polarized through a resistance connected in series to said power device and the other of said transistors being polarized through a further resistance defining said reference voltage, said means sensitive to temperature including a voltage divider used for the polarization of a transistor used to commutate to conduction when the temperature goes beyond a preset limit defined by said voltage divider, said transistor acting on said current mirror circuit so as to reduce said constant current supplying the transistors of the differential stage of comparator and thus vary said reference voltage.

11. A diagnostic circuit for units providing current control and protection against excessive heat dissipation for semiconductor power devices, comprising a comparator having a first input connected to the power device so as to be supplied with a voltage proportional to a current passing through the device and a second input connected to a reference voltage generator, a signal generator connected to the output of said comparator so as to generate a diagnostic signal whenever the output from the comparator indicates a growth of said voltage proportional to the current beyond a reference voltage generated by said reference voltage generator, and means sensitive to the temperature of the power device which act on said reference voltage generator so as to reduce said reference voltage in response to an increase in temperature beyond a preset limit, wherein said diagnostic signal generator includes an open-collector transistor, said comparator including a differential stage formed by two transistors having a common base supplied with a constant current through a current mirror circuit, one of said transistors being polarized through a resistance connected in series to said power device and the other of said transistors being polarized through a further resistance defining said reference voltage.

* * * * *